(12) United States Patent
Mohammadi et al.

(10) Patent No.: US 11,960,215 B2
(45) Date of Patent: Apr. 16, 2024

(54) RADIATION FILTER FOR A RADIATION SENSOR

(71) Applicant: ASML NETHERLANDS B.V., Veldhoven (NL)

(72) Inventors: Vahid Mohammadi, Eindhoven (NL); Yassin Chowdhury, Geldrop (NL); Pieter Cristiaan De Groot, Heeze (NL); Wouter Joep Engelen, Eindhoven (NL); Marcel Johannes Petrus Theodorus Van Der Hoorn, Antwerp (BE)

(73) Assignee: ASML NETHERLANDS B. V., Veldhoven (NL)

( * ) Notice: Subject to any disclaimer, the term of this patent is extended or adjusted under 35 U.S.C. 154(b) by 0 days.

(21) Appl. No.: 17/282,871

(22) PCT Filed: Sep. 19, 2019

(86) PCT No.: PCT/EP2019/075125
§ 371 (c)(1),
(2) Date: Apr. 5, 2021

(87) PCT Pub. No.: WO2020/083578
PCT Pub. Date: Apr. 30, 2020

(65) Prior Publication Data
US 2021/0349398 A1    Nov. 11, 2021

(30) Foreign Application Priority Data

Oct. 22, 2018    (EP) .................................... 18201678

(51) Int. Cl.
*H01L 31/18*    (2006.01)
*G03F 7/00*    (2006.01)
(Continued)

(52) U.S. Cl.
CPC ...... *G03F 7/7085* (2013.01); *H01L 31/02019* (2013.01); *H01L 31/02161* (2013.01); *H01L 31/02164* (2013.01); *H01L 31/1868* (2013.01)

(58) Field of Classification Search
CPC ............... G03F 7/7085; G03F 7/70308; G03F 7/70191; H01L 31/02019; H01L 31/02161;
(Continued)

(56) References Cited

U.S. PATENT DOCUMENTS

| 7,250,620 | B2 * | 7/2007 | Wurm | ................. | G03F 7/70575 |
| | | | | | 250/503.1 |
| 9,348,214 | B2 * | 5/2016 | Wang | ........................ | G03F 1/84 |

(Continued)

FOREIGN PATENT DOCUMENTS

| CN | 104797981 | 7/2015 |
| EP | 1480083 | 11/2004 |
| EP | 1267212 | 12/2022 |

OTHER PUBLICATIONS

International Search Report and Written Opinion issued in corresponding PCT Patent Application No. PCT/EP2019/075125, dated Jan. 17, 2020.
(Continued)

*Primary Examiner* — Hung V Nguyen
(74) *Attorney, Agent, or Firm* — Pillsbury Winthrop Shaw Pittman, LLP

(57) ABSTRACT

A radiation filter for reducing transmission of an unwanted wavelength of radiation. The radiation filter includes zirconium and $SiN_3$. The radiation filter may form part of a radiation sensor including a passivation layer arranged to receive radiation transmitted by the radiation filter, a photodiode arranged to receive radiation transmitted by the passivation layer, and circuit elements connected to the photodiode. The radiation sensor may perform optical mea-
(Continued)

surements as part of an extreme ultraviolet lithographic apparatus or a lithographic tool.

20 Claims, 8 Drawing Sheets

(51) Int. Cl.
*H01L 31/02* (2006.01)
*H01L 31/0216* (2014.01)

(58) Field of Classification Search
CPC ........... H01L 31/02164; H01L 31/1868; H01L 27/14625; G02B 5/208
See application file for complete search history.

(56) References Cited

U.S. PATENT DOCUMENTS

| | | | |
|---|---|---|---|
| 10,048,543 B2* | 8/2018 | Hoshina | G02F 1/133351 |
| 10,976,265 B2* | 4/2021 | Roobol | G01N 21/956 |
| 2006/0160031 A1 | 7/2006 | Wurm et al. | |
| 2006/0245044 A1* | 11/2006 | Apetz | B82Y 10/00 |
| | | | 359/359 |
| 2011/0149262 A1* | 6/2011 | Van Herpen | G03F 7/70308 |
| | | | 355/71 |
| 2012/0235049 A1 | 9/2012 | Wang | |
| 2013/0264481 A1 | 10/2013 | Chern et al. | |
| 2013/0277787 A1 | 10/2013 | Kim | |
| 2015/0285967 A1* | 10/2015 | Ventola | G02B 5/223 |
| | | | 359/566 |
| 2015/0294998 A1* | 10/2015 | Nihtianov | H01L 27/14643 |
| | | | 438/73 |

OTHER PUBLICATIONS

Mohammadi, V. et al.: "Low temperature PureB Technology for CMOS Compatible Photodetectors", resolver.tudelft.nl/uuid:f4f66452-8a52-42c2-aac7-dfdab4259a57, DOI: 10.5772/63344 (Aug. 31, 2016).
Shi, L. et al.: "Stability Characterization of High-Sensitivity Silicon-Based EUV Photodiodes in a Detrimental Environment", IEEE Sensors Journal, vol. 13, No. 5, pp. 1699-1707 (May 2013).
Canfield, L.R. et al: "Silicon photodiodes with integrated thin film filters for selective bandpasses in the extreme ultraviolet", Proc. of SPIE 2282 (Sep. 1994).
Rao, P. R. et al.: "Backside Illuminated CMOS Image Sensors for Extreme Ultraviolet Applications", *Sensors, 2014 IEEE*, Valencia, Spain, 2014, pp. 1660-1663 (Nov. 2, 2014).
Research Disclosure, Kenneth Mason Publications, vol. 566, No. 65, p. 730 (Jun. 1, 2011).
Office Action issued in corresponding Chinese Patent Application No. 201980069319.0, dated Jan. 3, 2024.

* cited by examiner

RADIATION FILTER FOR A RADIATION SENSOR

CROSS-REFERENCE TO RELATED APPLICATIONS

This application is the U.S. national phase entry of PCT Patent Application No. PCT/EP2019/075125 which was filed on Sep. 19, 2019, which claims the benefit of priority of European Patent Application No. 18201678.2 which was filed on Oct. 22, 2018, and which is incorporated herein in its entirety by reference.

FIELD

The present invention relates to a radiation filter and a radiation sensor comprising the radiation filter. The radiation sensor may form part of a lithographic apparatus, such as an extreme ultraviolet lithographic apparatus, or a lithographic tool.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Lithographic apparatus typically comprise radiation sensors for performing a variety of optical measurements such as, for example, measuring optical aberrations of different optical elements and/or measuring an alignment between a projected image and a previously formed pattern on the substrate, etc. Known radiation sensors are generally designed to detect wavelengths of radiation across the visible portion of the electromagnetic spectrum. EUV radiation may be difficult to detect without causing damage to a known radiation sensor. A known radiation sensor that is configured for use with an EUV lithographic apparatus is provided with a conversion layer (e.g. a scintillator) and an optical guide (e.g. a fibre optic plate). The conversion layer is configured to convert the EUV radiation into visible radiation such that the known radiation sensor can safely detect the converted radiation. The optical guide is configured to guide the visible radiation from the conversion layer towards a detection element (e.g. a camera) of the known radiation sensor. The presence of the conversion layer and/or the optical guide and/or any adhesives used to connect these features together and/or to the detection element may reduce an accuracy of measurements made using the known radiation sensor.

It is desirable to provide, for example, a method which obviates, or mitigates, one or more problems of the prior art, whether identified herein or elsewhere.

SUMMARY

According to a first aspect of the invention there is provided a radiation filter for reducing transmission of an unwanted wavelength of radiation, the radiation filter comprising zirconium and $SiN_3$.

The radiation filter comprising zirconium and $SiN_3$ advantageously transmits incident EUV radiation whilst reducing transmission of other forms of radiation such as DUV radiation, visible radiation and/or infrared radiation. This makes the radiation filter particularly advantageous when used for EUV radiation measurement purposes such as, for example, when used to perform measurements in an EUV lithographic process.

The radiation filter may include a first layer comprising the zirconium and a second layer comprising the $SiN_3$.

The first layer may be provided on the second layer.

The radiation filter may include a third layer comprising silicon.

The third layer may be provided on the first layer.

The radiation filter may include a third layer comprising the $SiN_3$. The first layer may be located between the second layer and the third layer.

The radiation filter may include a fourth layer comprising silicon. The fourth layer may be provided on the third layer.

The third layer may have a thickness of about 5 nm or more. The third layer may have a thickness of about 100 nm or less.

The third layer may have a thickness of about 5 nm or more. The third layer may have a thickness of about 200 nm or less.

The fourth layer may have a thickness of about 10 nm or more. The fourth layer may have a thickness of about 500 nm or less.

The first layer may have a thickness of about 10 nm or more. The first layer may have a thickness of about 500 nm or less.

The second layer may have a thickness of about 5 nm or more. The second layer may have a thickness of about 100 nm or less.

The radiation filter may further comprise an anti-reflection layer for increasing the transmission of at least one wavelength of radiation through the radiation filter.

The anti-reflection layer may comprise at least one of SiON, CrO, CrN, CrON, $SiN_3$, $SiO_2$ and $Al_2O_3$.

The radiation filter may further comprise a protective layer for reducing damage to the radiation filter caused by hydrogen radicals.

The protective layer may comprise at least one of SiN and $SiO_2$.

According to a second aspect of the invention there is provided a radiation sensor comprising the radiation filter of the first aspect of the invention, and further comprising a passivation layer arranged to receive radiation transmitted by the radiation filter, a photodiode arranged to receive radiation transmitted by the passivation layer, and circuit elements connected to the photodiode.

The radiation sensor comprising the radiation filter of the first aspect of the invention advantageously reduces or avoids the need for at least one of a conversion layer, an optical guide and adhesives, thereby simplifying the design of the radiation sensor, and improving a transmission, a resolution and an efficiency of the radiation sensor compared to known radiation sensors. The radiation sensor also advantageously experiences reduced blurring compared to known radiation sensors thereby improving an accuracy of measurements performed using the radiation sensor. The radiation sensor has been found to provide improved passivation and pinning (i.e. suppressing charge trapping) compared to known radiation sensors.

The passivation layer may comprise boron.

The radiation sensor may further comprise an adhesive layer. The adhesive layer may comprise silicon. The adhesive layer may be located between the passivation layer and the photodiode.

The photodiode may be a CMOS photodiode.

According to a third aspect of the invention, there is provided a lithographic apparatus arranged to project a pattern from a patterning device onto a substrate, the lithographic apparatus comprising the radiation sensor of the second aspect of the invention.

The lithographic apparatus comprising the radiation sensor having the radiation filter has been found to be sufficiently radiation hard for relatively high doses of EUV radiation for the entire lifetime (e.g. multiple years) of a lithographic tool. The lithographic apparatus according to the third aspect of the invention advantageously reduces the amount of time to perform lithographic measurements and thereby improves a throughput and an availability of the lithographic apparatus compared to known lithographic apparatus.

According to a fourth aspect of the invention, there is provided a lithographic tool for performing optical measurements, the lithographic tool comprising the radiation sensor of the second aspect of the invention.

According to a fifth aspect of the invention, there is provided a method of filtering radiation comprising passing the radiation through the radiation filter of the first aspect of the invention.

According to a sixth aspect of the invention, there is provided a method of performing an optical measurement comprising directing radiation at an object, collecting radiation that has interacted with the object, passing the collected radiation through a radiation filter according to the first aspect, and detecting the filtered radiation.

According to a seventh aspect of the invention, there is provided a method of manufacturing a radiation sensor comprising providing a substrate, forming an epitaxial layer on the substrate, forming a photodiode in the epitaxial layer, forming circuit elements that are connected to the photodiode, forming a passivation layer on the epitaxial layer, and forming a radiation filter comprising zirconium and $SiN_3$ on the passivation layer.

BRIEF DESCRIPTION OF THE DRAWINGS

Embodiments of the invention will now be described, by way of example only, with reference to the accompanying schematic drawings, in which.

DETAILED DESCRIPTION

Figure 1:
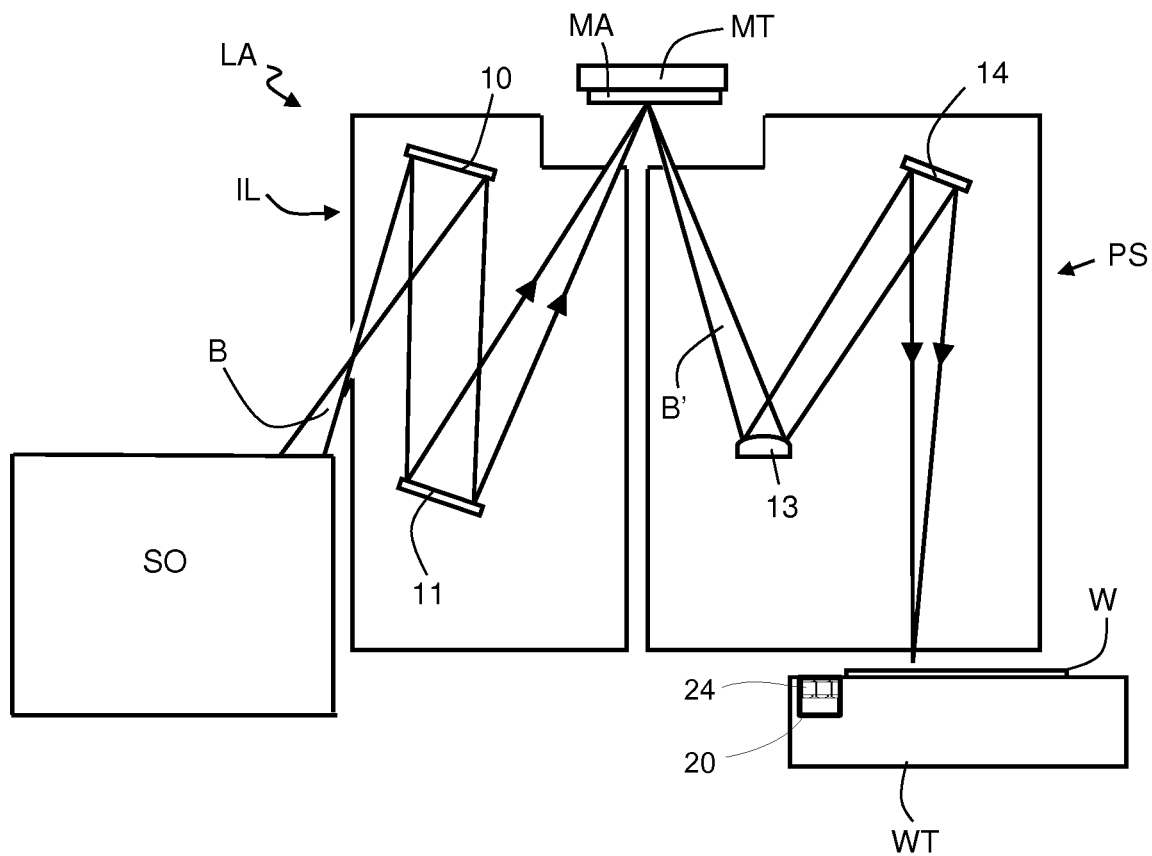
FIG. 1 depicts a lithographic system comprising a lithographic apparatus, a radiation source and a radiation sensor comprising a radiation filter according to an embodiment of the invention.

FIG. 1 shows a lithographic system comprising a radiation source SO and a lithographic apparatus LA comprising a radiation sensor 20 having a radiation filter 24 according to an embodiment of the invention. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

The lithographic apparatus comprises a radiation sensor 20 having a radiation filter 24 according to an embodiment of the invention. The radiation sensor 20 may be configured to detect a wavefront of radiation passing through the projection system PS and thereby determine optical aberrations of the projection system PS. The radiation sensor 20 may, for example, comprise a shearing interferometer.

Known radiation sensors are typically designed to detect wavelengths of radiation across the visible portion of the electromagnetic spectrum. EUV radiation may be difficult to detect without causing damage to a known radiation sensor. A known radiation sensor that is configured for use with an EUV lithographic apparatus is provided with a conversion layer (e.g. a scintillator) and an optical guide (e.g. a fibre optic plate). The conversion layer is configured to convert the EUV radiation into visible radiation such that the known radiation sensor can safely detect the converted radiation. The optical guide is configured to guide the visible radiation from the conversion layer towards a detection element (e.g. a camera) of the known radiation sensor. The conversion layer is connected to the optical guide via a layer of adhesive. The optical guide is connected to the camera via a layer of adhesive. The presence of the conversion layer, the optical guide and the layers of adhesive reduce an accuracy of measurements made using the known radiation sensor. For example, the layers of adhesive may introduce significant blurring of an image passing through the adhesive to the camera and/or reduce an intensity of the radiation reaching the camera. Blurring of the image may introduce measurement errors and/or reduce a resolution of the known radiation sensor.

The radiation sensor 20 shown in FIG. 1 does not include the conversion layer, the optical guide and the layers of adhesive discussed above in relation to known radiation sensors. This advantageously avoids the issues of blurring and transmission loss associated with known radiation sensors, and thereby improves an accuracy and/or a resolution of the radiation sensor 20 compared to known radiation sensors. The increased transmission of radiation through the radiation sensor 20 increases an efficiency of the radiation sensor. The improved efficiency of the radiation sensor 20 may in turn reduce the amount of time required to perform measurements made using the radiation sensor, and thereby improve a throughput of the lithographic apparatus LA. The radiation sensor 20 also advantageously has a simpler design due to the reduced number of components therein.

An important consequence of removing these components from the radiation sensor 20 is that the radiation sensor directly detects EUV radiation (i.e. the EUV radiation is no longer converted to less energetic photons before being detected). EUV radiation can be damaging to components of a radiation sensor because of the relatively high energy of the photons that are to be detected. Known radiation sensors typically comprise a silicon oxide passivation layer that forms a boundary with a silicon layer (e.g. a CMOS image sensor). EUV photons may interact with the silicon oxide layer in various ways and thereby reduce an optical and/or electrical responsivity of the radiation sensor. For example, EUV photons may contribute to the generation of electric charge carriers (e.g. electrons, holes, etc.) in the silicon oxide passivation layer. The generated charge carriers may accumulate and/or contribute to the generation of defects at the boundary between the silicon layer and the silicon oxide layer and/or generate defects in gate regions of transistors located proximate pixels of the known radiation sensor. These defects may lead to undesirable effects for the known radiation sensor such as measurement noise, dark current, reduced optical responsivity, fixed pattern noise, etc. Said undesirable effects may, for example, render the known radiation sensor unsuitable for use within a month. EUV lithographic apparatus tend to use relative high doses of EUV radiation (e.g. about 6 kJ $cm^{-2}$) and tend to have long operational lifetimes (e.g. multiple years). Known radiation sensors are not sufficiently resistant to such high doses of EUV radiation over such long periods of time. A known radiation sensor would have to be regularly repaired and/or replaced, thereby negatively affecting a throughput of the lithographic apparatus and increasing the cost of maintenance of the lithographic apparatus.

Figure 2:
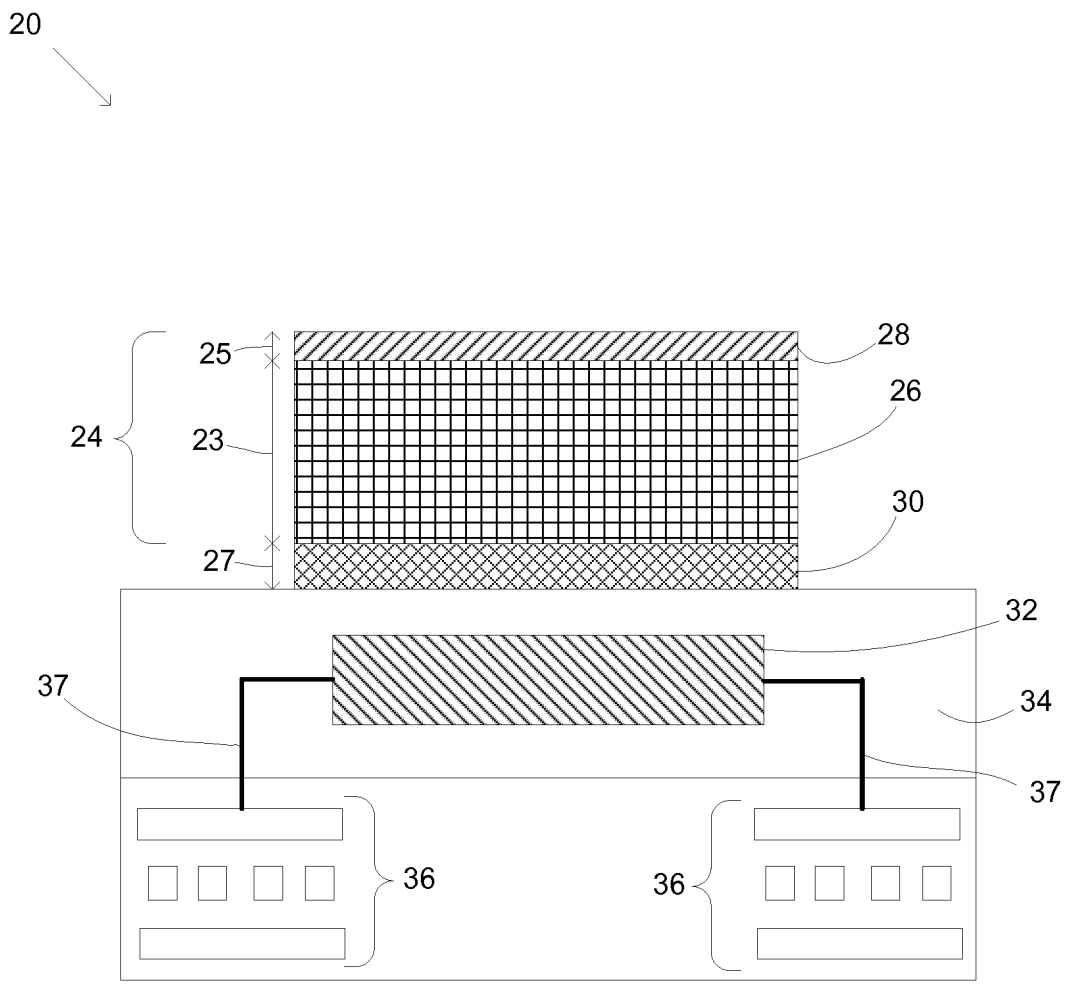
FIG. 2 schematically depicts a cross-sectional view of a portion of a radiation sensor comprising a radiation filter according to an embodiment of the invention.

FIG. 2 schematically depicts a cross-sectional view of a portion of a radiation sensor 20 comprising a radiation filter 24 according to an embodiment of the invention. The radiation filter 24 comprises zirconium and $SiN_3$. The radiation filter 24 includes a first layer 26 comprising the zirconium and a second layer 28 comprising the $SiN_3$. The first layer 26 is provided on the second layer 28. The first layer 26 may be deposited on the second layer 28 using, for example, sputter deposition. The first layer 26 may have a thickness 23 of about 10 nm or more. The first layer 26 may have a thickness 23 of about 500 nm or less. For example, the first layer 26 may have a thickness of about 100 nm. The second layer 28 may have a thickness 25 of about 5 nm or more. The second layer 28 may have a thickness 25 of about 100 nm or less.

The radiation filter 24 is configured to reduce the transmission of unwanted wavelengths of radiation through the radiation filter 24 whilst allowing transmission of desired wavelengths of radiation. The radiation filter 24 of the present invention is configured to transmit EUV radiation whilst filtering out other types of radiation (e.g. visible radiation, deep ultraviolet (DUV) radiation and/or infrared radiation). The zirconium may be configured to block incident DUV radiation and visible radiation whilst transmitting incident EUV radiation. For example, if the first layer 26 comprising the zirconium has a thickness of about 100 nm then the first layer 26 may transmit about 0% of incident DUV radiation, 0.1% of incident visible radiation and about 70% of incident EUV radiation. The $SiN_3$ may be configured to act as a capping layer for the zirconium to reduce and/or prevent oxidation of the zirconium whilst also transmitting incident EUV radiation. For example, if the second layer comprising $SiN_3$ had a thickness of about 10 nm then the second layer 28 may transmit about 90% of incident EUV radiation.

The radiation sensor 20 further comprises a passivation layer 30. The passivation layer 30 is provided on the radiation filter 24. In the example of FIG. 2, the passivation layer is provided on the first layer 26 comprising zirconium. The passivation layer 30 may comprise boron. The boron may be pure boron (i.e. boron that has not been doped). The boron may be formed at a relatively low temperature (e.g. between about 400° C. and about 450° C.) in order to avoid damaging other components of the radiation sensor 20 with high temperatures during manufacture of the radiation sensor 20. The passivation layer 30 may have a thickness 27 of greater than about 2 nm. The passivation layer 30 may have a thickness 27 of less than about 10 nm.

The radiation sensor 20 further comprises a photodiode 32. The photodiode 32 is arranged to receive radiation transmitted by the passivation layer 30. The photodiode 32 may be a PIN photodiode. The photodiode 32 may be a CMOS photodiode. The photodiode 32 is formed in and/or on an epitaxial layer 34. The photodiode 32 may, for example, have a thickness of about 4 µm. It will be appreciated that the Figures are schematic and that the relative size of the radiation filter 24 has been increased compared to the size of the photodiode 32 in order to improve the clarity of the Figures. The epitaxial layer 34 is provided on the passivation layer 30. The epitaxial layer 34 and/or the photodiode 32 may comprise silicon. For example, a boron-silicon junction may be formed between the passivation layer 30 and the epitaxial layer 34.

The radiation sensor 20 further comprises circuit elements 36. An electrically conducting path 37 exists between the circuit elements 36 and the photodiode 32 such that electrical currents generated by interactions between incident radiation and the photodiode 32 are received by the circuit elements 36. Electrical currents generated by the photodiode 32 may, for example, travel to the circuit elements 36 by means of charge migration through the epitaxial layer 34. The electrically conducting path 37 has been represented as two bold lines in the Figures to make it clear that electrical charge generated by the photodiode 32 reaches the circuit elements 36. It will be appreciated that electrical charge may not travel through the radiation sensor exactly along the lines representing the electrically conducting path 37. The circuit elements 36 may, for example, comprise metal interconnects, transistors, vias, etc. Deep implantation may be used to isolate different pixels of the radiation sensor 20 (e.g. different photodiodes 32) from each other.

Figure 3:
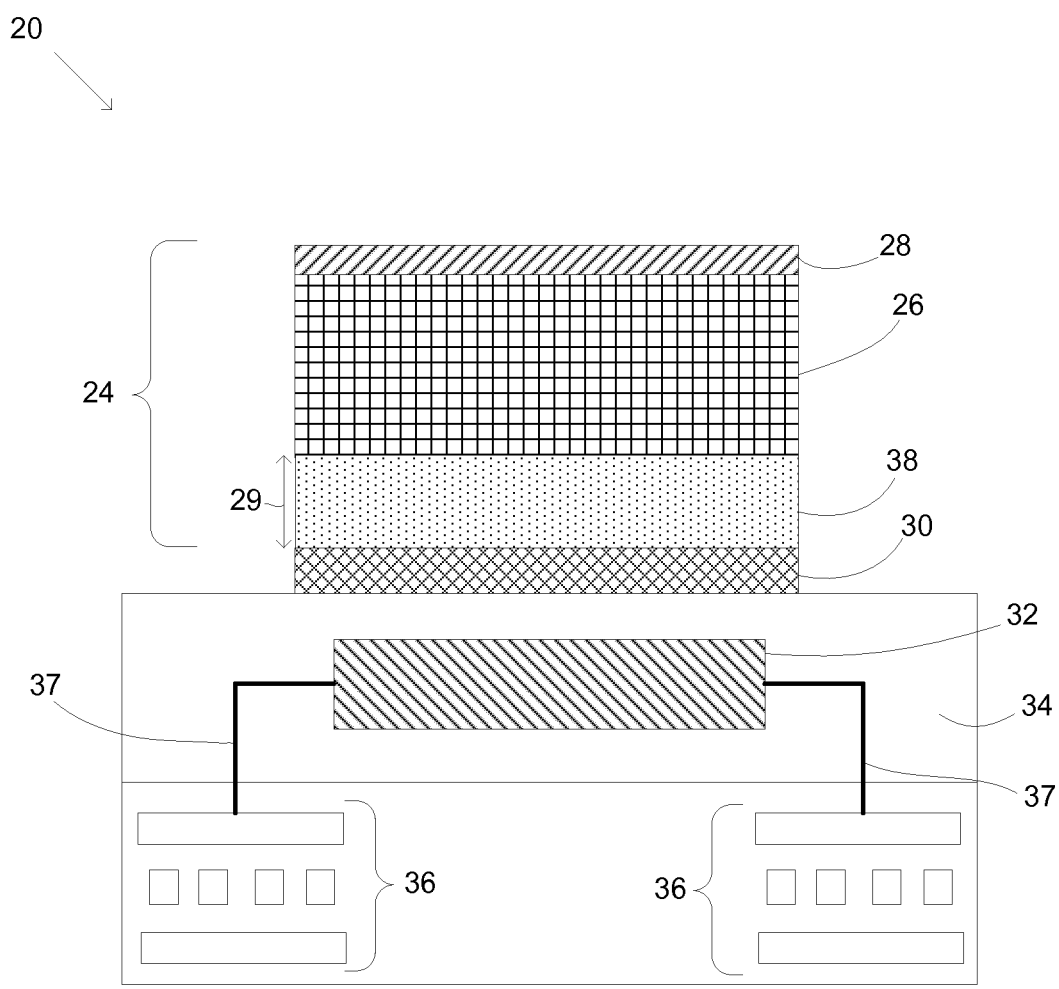
FIG. 3 schematically depicts a cross-sectional view of a portion of a radiation sensor comprising a radiation filter having a silicon layer according to an embodiment of the invention.

FIG. 3 schematically depicts a cross-sectional view of a portion of a radiation sensor 20 comprising a radiation filter 24 having a silicon layer 38 according to an embodiment of the invention. The radiation filter 24 is the same as that shown in FIG. 2 except that it now also includes a third layer comprising silicon 38. In the example of FIG. 3, the third layer 38 is provided on the first layer 26. The third layer 38 may have a thickness 29 of about 5 nm or more. The third layer 38 may have a thickness 29 of about 200 nm or less. The third layer comprising silicon 38 may assist with joining the radiation filter 24 and the passivation layer comprising boron 30. That is, the third layer comprising silicon 38 may act as an adhesive layer. The third layer comprising silicon 38 may reduce the transmission of incident DUV radiation whilst allowing the transmission of incident EUV radiation. For example, if the third layer 38 comprising the silicon has a thickness 29 of about 50 nm then the third layer 28 may transmit about 90% of incident EUV radiation. As another example, if the third layer 38 comprising the silicon has a thickness 29 of about 200 nm then the third layer 28 may transmit about 70% of incident EUV radiation.

Figure 4:
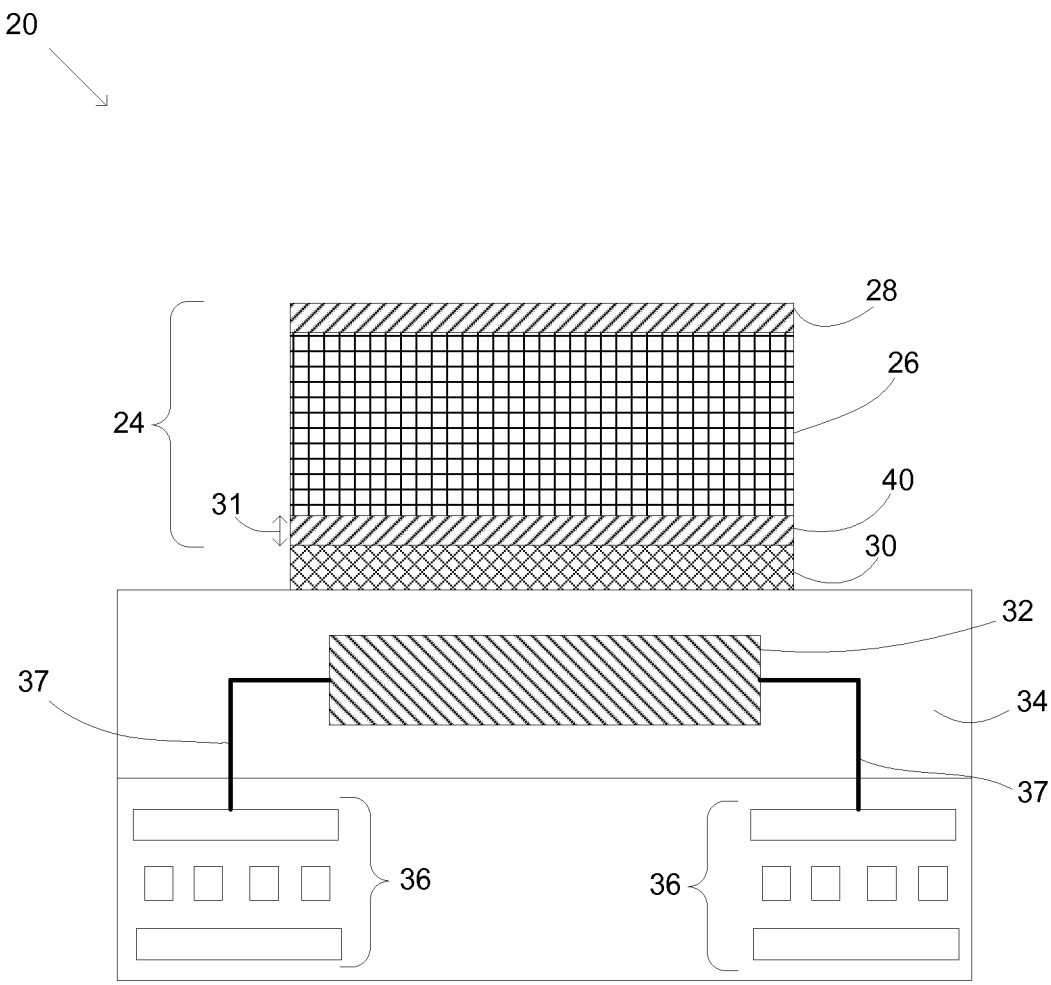
FIG. 4 schematically depicts a cross-sectional view of a portion of a radiation sensor comprising a radiation filter having a plurality of $SiN_3$ layers according to an embodiment of the invention.

FIG. 4 schematically depicts a cross-sectional view of a portion of a radiation sensor 20 comprising a radiation filter 24 having a plurality of $SiN_3$ layers 28, 40 according to an embodiment of the invention. The radiation filter 24 is the same as that shown in FIG. 2 except that it now also includes a third layer comprising $SiN_3$ 40. The first layer 26 is located between the second layer 28 and the third layer 40. The third layer comprising $SiN_3$ 40 may have a thickness 31 of about 5 nm or more. The third layer comprising $SiN_3$ 40 may have a thickness 31 of about 100 nm or less. For example, if the third layer 40 comprising $SiN_3$ had a thickness 31 of about 10 nm then the third layer 40 may transmit about 90% of incident EUV radiation. The third layer comprising $SiN_3$ 40 may be configured to act as a capping layer and/or reduce unwanted diffusion of silicon and/or zirconium.

Figure 5:
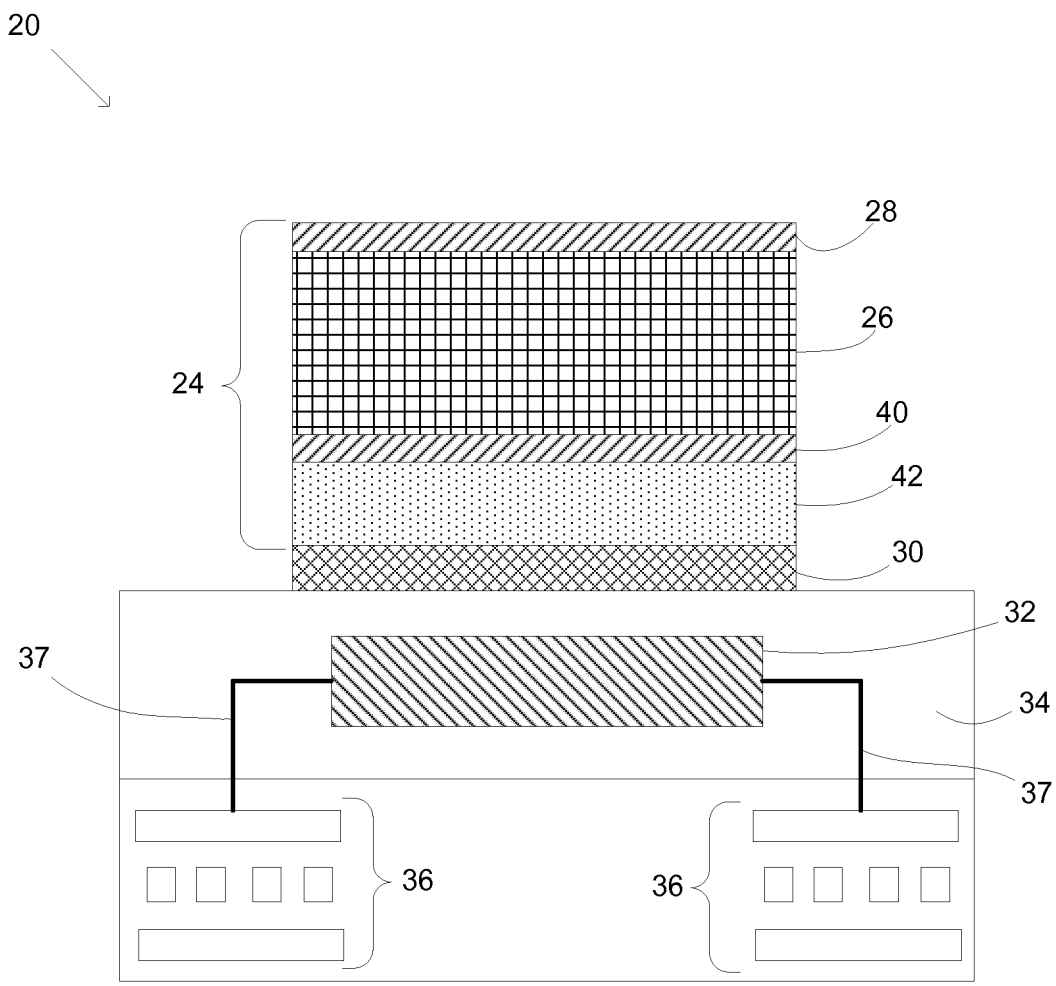
FIG. 5 schematically depicts a cross-sectional view of a portion of a radiation sensor comprising a radiation filter having a plurality of layers comprising $SiN_3$ and a layer comprising silicon according to an embodiment of the invention.

FIG. 5 schematically depicts a cross-sectional view of a portion of a radiation sensor 20 comprising a radiation filter 24 having a plurality of layers comprising $SiN_3$ 28, 40 and a layer comprising silicon 42 according to an embodiment of the invention. The radiation filter 24 is the same as that shown in FIG. 2 except that it now also includes a third layer comprising $SiN_3$ 40 and a fourth layer comprising silicon 42. The first layer comprising zirconium 26 is located between the second layer comprising $SiN_3$ 28 and the third layer comprising $SiN_3$ 40. The fourth layer 42 is provided on the third layer 40. The third layer 40 may have a thickness of about 5 nm or more. The third layer 40 may have a thickness of about 100 nm or less. For example, if the third layer comprising $SiN_3$ 40 has a thickness of about 10 nm then the third layer 40 may transmit about 90% of incident EUV radiation. The fourth layer 42 may have a thickness of about 10 nm or more. The fourth layer 42 may have a thickness of about 500 nm or less. For example, if the fourth layer 42 comprising the silicon has a thickness of about 50 nm then the fourth layer 42 may transmit about 90% of incident EUV radiation. The third layer comprising $SiN_3$ 40 may be configured to act as a capping layer and/or reduce unwanted diffusion of silicon and/or zirconium. The fourth layer comprising silicon 42 may assist with joining the radiation filter 24 and the passivation layer comprising boron 30. That is, the fourth layer comprising silicon 42 may act as an adhesive layer. The fourth layer comprising silicon 42 may reduce the transmission of incident DUV radiation whilst allowing the transmission of incident EUV radiation.

Figure 6:
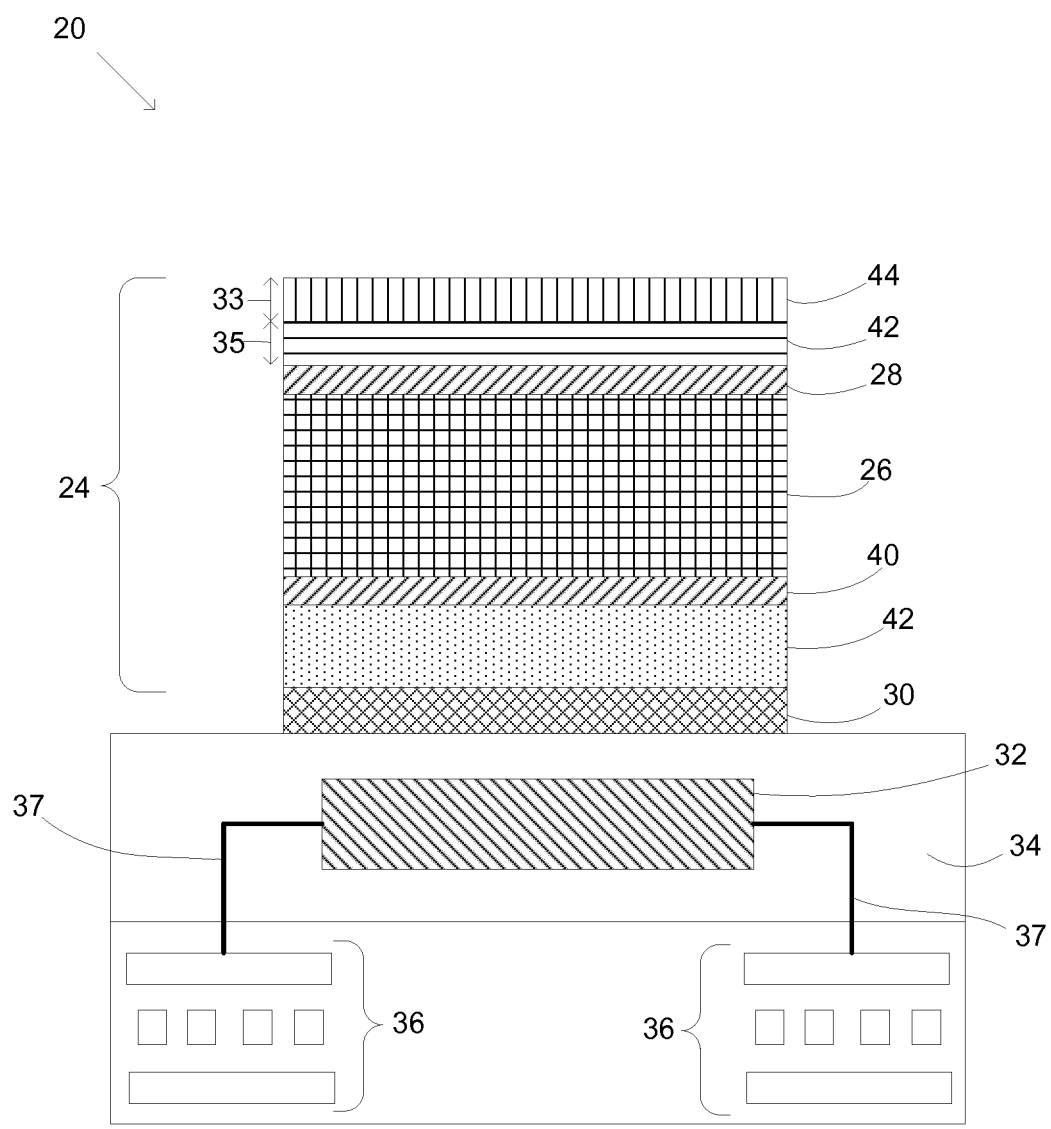
FIG. 6 schematically depicts a cross-sectional view of a portion of a radiation sensor comprising a radiation filter having an anti-reflection layer and a protective layer 44 according to an embodiment of the invention.

FIG. 6 schematically depicts a cross-sectional view of a portion of a radiation sensor 20 comprising a radiation filter 24 having an anti-reflection layer 42 and a protective layer 44 according to an embodiment of the invention. The radiation filter 24 is the same as that shown in FIG. 5 except that it now also includes the anti-reflection layer 42 and a protective layer 44. The protective layer 44 is configured to reduce damage to the radiation filter caused by, for example, hydrogen radicals whilst also transmitting incident EUV radiation. The protective layer 44 may be configured to reduce transmission of non-EUV radiation such as DUV radiation and visible radiation. The protective layer may, for example, comprise SiN and/or $SiO_2$. The protective layer 44 may, for example, have a thickness 33 of about 100 nm or more. The protective layer 44 may, for example, have a thickness of about 1 µm or less.

The anti-reflection layer 42 is configured to increase the transmission of at least one wavelength of radiation through the radiation filter. For example, the anti-reflection layer 42 may be configured to increase the transmission of EUV radiation through to the photodiode 32. The anti-reflection layer 42 may, for example, comprise at least one of SiON, CrO, CrN, CrON, $SiN_3$, $SiO_2$ and $Al_2O_3$. The anti-reflection layer 42 may, for example have a thickness 35 of about 1 µm or less.

The radiation sensors 20 described above in relation to FIGS. 2-6 have a greater efficiency compared to known radiation sensors and have an improved stability and lifetime compared to known radiation sensors, including when under continuous exposure to high doses of EUV radiation (up to about 6 kJ cm$^{-2}$) for multiple years. The boron-silicon bonds at the interface between the passivation layer 30 and the epitaxial layer 34 are very strong and stable even under very high doses of highly energetic radiation (such as EUV radiation) and/or highly energetic particles (e.g. hydrogen radicals). The passivation layer comprising boron 30 may behave like a semi-metallic layer and may have a reduced risk of becoming electrically charged due to exposure to a high dose of highly energetic radiation or particles. Boron atoms at the boron-silicon junction may act to passivate dangling bonds at the silicon surface. The boron-silicon junction may contribute to the formation of a p-type semiconductor layer proximate the surface of the silicon which creates an internal electric field that may reduce the number of photo-generated electric charge carriers reaching the silicon surface and negatively affecting a performance of the radiation sensor.

Degradation and radiation hardness of the radiation sensor 20 has been tested under different doses of EUV radiation (i.e. about 13.5 nm wavelength radiation). Compared to known radiation sensors comprising a silicon oxide passivation layer and lacking a radiation filter according to the present invention, the radiation sensor 20 is more stable and more radiation hard and can successfully operate under very high doses of high energy radiation (e.g. up to about 100 kJ $cm^{-2}$). In comparison, the optical responsivity of the known radiation sensor degrades by about 6% after exposure to 0.96 J $cm^{-2}$ EUV radiation, about 34% degradation after exposure to 10 J $cm^{-2}$ EUV radiation, and about 92% degradation after exposure to about 100 J $cm^{-2}$ EUV radiation. The optical responsivity of the known radiation sensor was found to be negligible after exposure to about 100 J $cm^{-2}$ EUV radiation.

The radiation sensor 20 may be a two-dimensional pixel array, or one dimensional pixel array sensor. The radiation sensor 20 may be fabricated using CCD (charge coupled device) or CMOS (complementary metal oxide semiconductor) fabrication technology.

A method of performing an optical measurement using the radiation sensor 20 of any of FIGS. 2 to 6 may comprise directing radiation at an object such as, for example, a grating. Radiation that has interacted with the object may then be collected using, for example, lenses and or mirrors. The collected radiation may then be passed through the radiation filter 24 of the radiation sensor 20. Radiation that has been filtered by the radiation filter 24 may then be detected by the photodiode 32 of the radiation sensor 20. The photodiode 32 may generate an electrical current based on the received filtered radiation and provide the electrical current to the circuit elements 36. An electrically conducting path 37 exists between the circuit elements 36 and the photodiode 32 such that electrical currents generated by interactions between incident radiation and the photodiode 32 are received by the circuit elements 36. The circuit elements 36 may be configured to generate a measurement signal based on the received electrical current. The measurement signal may, for example, be provided to a memory device and/or a processor for storage and/or analysis.

A method of forming a radiation sensor 20 comprising a radiation filter 24 according to an embodiment of the invention involves forming an epitaxial layer on a substrate (e.g. a silicon on-insulator substrate), forming a photodiode (e.g. a CMOS photodiode) in the epitaxial layer, forming circuit elements (e.g. metal interconnects) in the epitaxial layer that are connected to the photodiode, forming a passivation layer on the epitaxial layer, and, forming a radiation filter comprising zirconium and $SiN_3$ on the passivation layer. Greater details of two different methods of manufacturing alternative versions of a radiation sensor 20 comprising a radiation filter 24 according to the present invention are discussed below in relation to FIG. 7 and FIG. 8.

Figure 7:
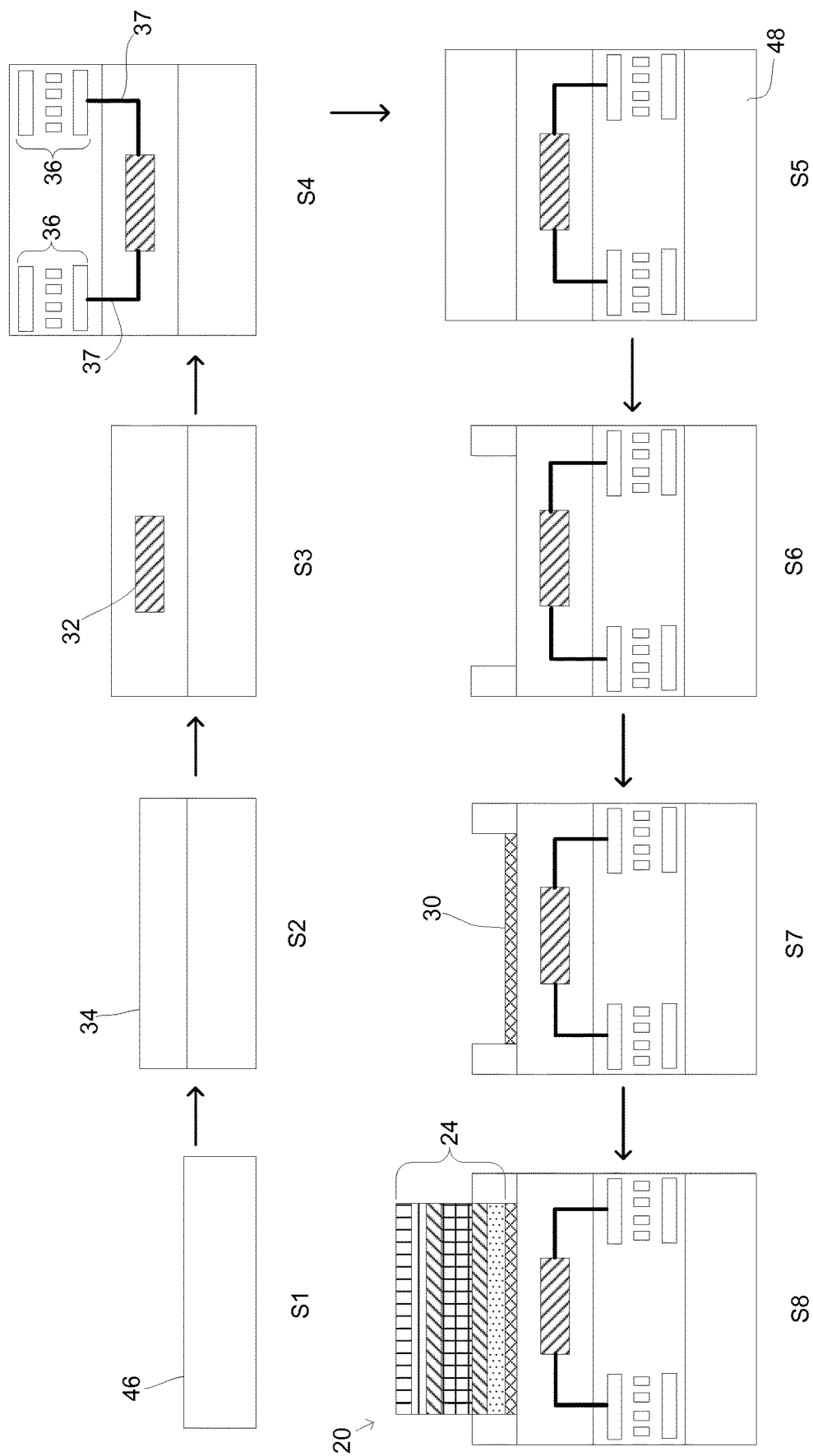
FIG. 7 schematically depicts a method of manufacturing a back-side illuminated radiation sensor comprising a radiation filter according to an embodiment of the invention; and, FIG. 8 schematically depicts a method of manufacturing a front-side illuminated radiation sensor comprising a radiation filter according to an embodiment of the invention.

FIG. 7 schematically depicts a method of manufacturing a back-side illuminated radiation sensor comprising a radiation filter according to an embodiment of the invention. A back-side illuminated radiation sensor is configured to receive incident radiation at the photodiode without the radiation having to pass by circuit elements of the radiation sensor.

A first step S1 includes providing a substrate 46. The substrate 46 may, for example, comprise a silicon-on-insulator wafer.

A second step S2 includes forming an epitaxial layer 34 on the substrate 46. The epitaxial layer 34 may be a p-doped epitaxial layer having a doping concentration of about $1\times10^{14}$ atoms per cubic meter or more. The epitaxial layer 34 may be a p-doped epitaxial layer having a doping concentration of about $1\times10^{16}$ atoms per cubic meter or less. The epitaxial layer 34 may have a thickness of about 10 μm or more. The epitaxial layer 34 may have a thickness of about 50 μm or less.

A third step S3 includes forming a photodiode 32 in the epitaxial layer 34. The photodiode 32 may be a PIN photodiode. The photodiode 32 may be a CMOS photodiode. Other implantations may be performed to form other structures and/or features of a radiation sensor such as, for example, a floating diffusion region, a transfer gate, etc.

A fourth step S4 includes forming circuit elements 36 that are connected to the photodiode 32. The circuit elements 36 may, for example, comprise metal interconnects, transistors, vias, etc. The circuit elements 36 may be formed in and/or on the epitaxial layer 34 using, for example, standard sub-micron CMOS processing techniques. The circuit elements 36 may, for example, include multiple layers of metal interconnects. An electrically conducting path 37 exists between the circuit elements 36 and the photodiode 32 such that electrical currents generated by interactions between incident radiation and the photodiode 32 are received by the circuit elements 36. Electrical currents generated by the photodiode 32 may, for example, travel to the circuit elements 36 by means of charge migration through the epitaxial layer 34.

A fifth step S5 includes attaching a support layer 48 to the circuit elements 36 and flipping the radiation sensor 20 over. The support layer 48 may, for example, comprise a handling wafer.

A sixth step S6 includes back-thinning and/or grinding the substrate 46 to access the epitaxial layer 34. The sixth step S6 may be performed using physical and/or chemical etching/grinding to reach a desired thickness of the epitaxial layer 34.

A seventh step S7 includes forming a passivation layer 30 on the epitaxial layer 34. The passivation layer 30 may comprise boron. The boron may be pure boron (i.e. boron that has not been doped). The boron may be deposited on the epitaxial layer 34 using chemical vapor deposition. The boron may be formed at a relatively low temperature (e.g. between about 400° C. and about 450° C.) in order to avoid damaging other components of the radiation sensor 20 with high temperatures during manufacture of the radiation sensor 20. The deposition of boron may, for example, involve providing a mixture of diborane gas and hydrogen gas. A thickness of the passivation layer 30 may depend on an intended use of the radiation sensor 20. The passivation layer 30 may have a thickness of greater than about 2 nm. The thickness of the passivation layer 30 may be less than about 10 nm. A minimum thickness of the passivation layer 30 may at least partially depend upon reducing the presence of pinholes and/or the formation of a suitably uniform passivation layer. A maximum thickness of the passivation layer 30 may at least partially depend upon a desired amount of absorption of incident radiation and/or charged particles by the passivation layer and/or an amount of time required to form the passivation layer (i.e. in general, thicker passivation layers take longer to form via deposition).

The seventh step S7 may optionally comprise cleaning the surface of the epitaxial layer 34 in order to reduce the presence of metal and/or organic contaminants, native oxides, etc. Cleaning the surface of the epitaxial layer 34 may comprise, for example, hydrogen fluoride vapor etching followed by rinsing the surface of the epitaxial layer with a dilute hydrogen fluoride solution and drying the surface in such a way as to reduce the presence of water marks (e.g. the Marangoni drying technique). After cleaning, the radiation sensor 20 may be transported to a deposition tool in a short amount of time (e.g. less than about 5 minutes) to reduce the risk of contamination. The deposition tool may keep the radiation sensor in a protective environment (e.g. an environment comprising a dry and inert atmosphere such as nitrogen gas). The boron layer 30 may then be deposited on the epitaxial layer 34 using the deposition tool. The deposition may be selective and/or uniform over an active area of the photodiode 32.

An eighth step S8 includes forming a radiation filter 24 comprising zirconium and $SiN_3$ on the passivation layer 30. For example, the radiation filter 24 comprising zirconium and $SiN_3$ may be deposited on the passivation layer 30 via layer deposition such as, for example, sputter deposition. The radiation filter 24 formed on the passivation layer may be any of the radiation filters 24 described in relation to FIGS. 2 to 6.

Figure 8:
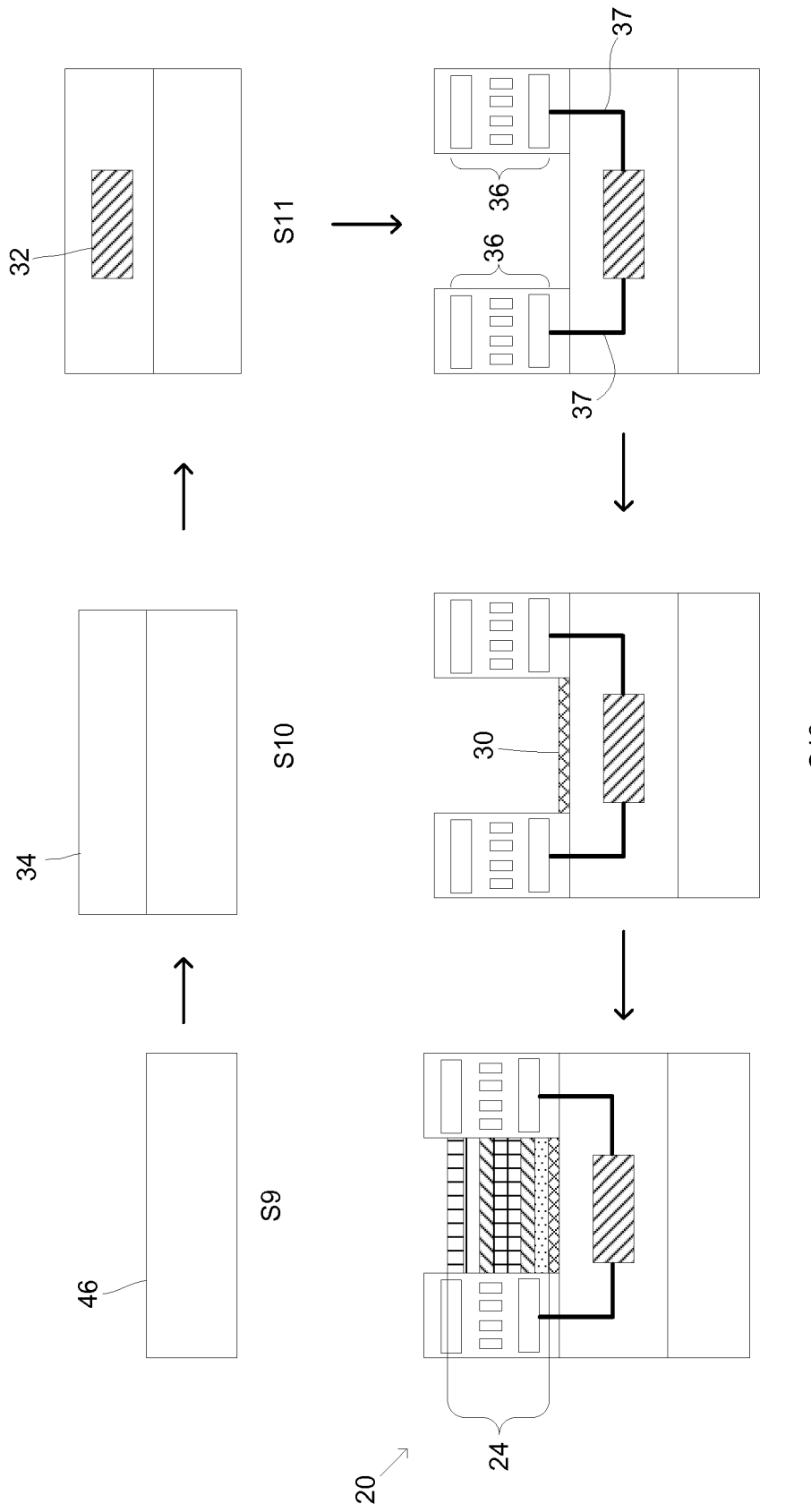

FIG. 8 schematically depicts a method of manufacturing a front-side illuminated radiation sensor 20 comprising a radiation filter 24 according to an embodiment of the invention. A front-side illuminated radiation sensor is configured to receive incident radiation at the photodiode 32 after the radiation has passed by circuit elements 36 of the radiation sensor 20.

A first step S9 includes providing a substrate 46. The substrate 46 may, for example, comprise a silicon-on-insulator wafer.

A second step S10 includes forming an epitaxial layer 34 on the substrate 46. The epitaxial layer 34 may be a p-doped epitaxial layer having a doping concentration of about $1 \times 10^{14}$ atoms per cubic meter or more. The epitaxial layer 34 may be a p-doped epitaxial layer having a doping concentration of about $1 \times 10^{16}$ atoms per cubic meter or less. The epitaxial layer 34 may have a thickness of about 10 μm or more. The epitaxial layer 34 may have a thickness of about 50 μm or less.

A third step S11 includes forming a photodiode 32 in the epitaxial layer 34. The photodiode 32 may be a PIN photodiode. The photodiode 32 may be a CMOS photodiode. Other implantations may be performed to form other structures and/or features of a radiation sensor such as, for example, a floating diffusion region, a transfer gate, etc.

A fourth step S12 includes forming circuit elements 36 that are connected to the photodiode 32. The circuit elements 36 may, for example, comprise metal interconnects, transistors, vias, etc. The circuit elements 36 may be formed in and/or on the epitaxial layer 34 using, for example, standard sub-micron CMOS processing techniques. The circuit elements 36 may, for example, include multiple layers of metal interconnects. An electrically conducting path 37 exists between the circuit elements 36 and the photodiode 32 such that electrical currents generated by interactions between incident radiation and the photodiode 32 are received by the circuit elements 36. Electrical currents generated by the photodiode 32 may, for example, travel to the circuit elements 36 by means of charge migration through the epitaxial layer 34.

A fifth step S13 includes forming a passivation layer 30 on the epitaxial layer 34. The passivation layer 30 may comprise boron. The boron may be pure boron (i.e. boron that has not been doped). The boron may be deposited on the epitaxial layer 34 using chemical vapor deposition. The boron may be formed at a relatively low temperature (e.g. between about 400° C. and about 450° C.) in order to avoid damaging other components of the radiation sensor 20 with high temperatures during manufacture of the radiation sensor 20. The deposition of boron may, for example, involve providing a mixture of diborane gas and hydrogen gas. A thickness of the passivation layer 30 may depend on an intended use of the radiation sensor 20. The passivation layer 30 may have a thickness of greater than about 2 nm. The thickness of the passivation layer 30 may be less than about 10 nm. A minimum thickness of the passivation layer 30 may at least partially depend upon reducing the presence of pinholes and/or the formation of a suitably uniform passivation layer. A maximum thickness of the passivation layer 30 may at least partially depend upon a desired amount of absorption of incident radiation and/or charged particles by the passivation layer and/or an amount of time required to form the passivation layer (i.e. in general, thicker passivation layers take longer to form via deposition).

The fifth step S13 may optionally comprise cleaning the surface of the epitaxial layer 34 in order to reduce the presence of metal and/or organic contaminants, native oxides, etc. Cleaning the surface of the epitaxial 34 layer may comprise, for example, hydrogen fluoride vapor etching followed by rinsing the surface of the epitaxial layer with a dilute hydrogen fluoride solution and drying the surface in such a way as to reduce the presence of water marks (e.g. the Marangoni drying technique). After cleaning, the radiation sensor 20 may be transported to a deposition tool in a short amount of time (e.g. less than about 5 minutes) to reduce the risk of contamination. The deposition tool may keep the radiation sensor 20 in a protective environment (e.g. an environment comprising a dry and inert atmosphere such as nitrogen gas). The boron layer 30 may then be deposited on the epitaxial layer 34 using the deposition tool. The deposition may be selective and/or uniform over an active area of the photodiode 32.

A sixth step S14 includes forming a radiation filter 24 comprising zirconium and $SiN_3$ on the passivation layer 30. The radiation filter 24 formed on the passivation layer 30 may be any of the radiation filters described in relation to FIGS. 2 to 6.

It will be appreciated that the words "first", "second", "third" and "fourth" as used herein are merely intended to differentiate and identify different layers of the radiation filter. The words "first", "second", "third" and "fourth" as used herein are not intended to limit the invention by conveying any spatial ordering of the layers of the radiation filter. For example, the words "first", "second", "third" and "fourth" are not intended to indicate the order of the layers that incident radiation interacts with when the radiation filter is being used. The words "first", "second", "third" and "fourth" as used herein are not intended to limit the invention by conveying any temporal ordering of the layers. For example, the words "first", "second", "third" and "fourth" are not intended to indicate the temporal order in which the layers are formed when manufacturing the radiation filter.

Although the radiation filter 24 comprising zirconium and $SiN_3$ has been described above in relation to a radiation sensor 20 detecting optical aberrations of a lithographic apparatus, it will be appreciated that the radiation filter may be applied to any type of radiation sensor and/or any other optical device or surface. For example, the radiation filter may be applied to an alignment sensor for measuring an alignment between the substrate and the mask, a topography sensor for measuring a height of a surface of the substrate, etc.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions. The radiation sensor may form part of a lithographic tool for performing optical measurements.

Although specific reference may have been made above to the use of embodiments of the invention in the context of optical lithography, it will be appreciated that the invention, where the context allows, is not limited to optical lithography and may be used in other applications, for example imprint lithography.

Embodiments are Provided According to the Following Clauses

1. A radiation filter for reducing transmission of an unwanted wavelength of radiation, the radiation filter comprising zirconium and $SiN_3$.
2. The radiation filter of clause 1, wherein the radiation filter includes a first layer comprising the zirconium and a second layer comprising the $SiN_3$.
3. The radiation filter of clause 2, wherein the first layer is provided on the second layer.
4. The radiation filter of clause 2 or clause 3, wherein the radiation filter includes a third layer comprising silicon.
5. The radiation filter of clause 4, wherein the third layer is provided on the first layer.
6. The radiation filter of clause 2 or clause 3, wherein the radiation filter includes a third layer comprising the $SiN_3$ and wherein the first layer is located between the second layer and the third layer.
7. The radiation filter of clause 6, wherein the radiation filter includes a fourth layer comprising silicon and wherein the fourth layer is provided on the third layer.
8. The radiation filter of clause 6 or clause 7, wherein the third layer has a thickness of between about 5 nm and about 100 nm.
9. The radiation filter of clause 4 or clause 5, wherein the third layer has a thickness of between about 5 nm and about 200 nm.
10. The radiation filter of clause 7, wherein the fourth layer has a thickness of between about 10 nm and about 500 nm.
11. The radiation filter of any of clauses 2 to 10, wherein the first layer has a thickness of between about 10 nm and about 500 nm.
12. The radiation filter of any of clauses 2 to 11, wherein the second layer has a thickness of between about 5 nm and about 100 nm.
13. The radiation filter of any of clauses 1 to 12, further comprising an anti-reflection layer for increasing the transmission of at least one wavelength of radiation through the radiation filter.
14. The radiation filter of clause 13, wherein the anti-reflection layer comprises at least one of SiON, CrO, CrN, CrON, $SiN_3$, $SiO_2$ and $Al_2O_3$.
15. The radiation filter of any of clauses 1 to 14, further comprising a protective layer for reducing damage to the radiation filter caused by hydrogen radicals.
16. The radiation filter of clause 15, wherein the protective layer comprises at least one of SiN and $SiO_2$.
17. A radiation sensor comprising:
    the radiation filter of any of clauses 1 to 16;
    a passivation layer arranged to receive radiation transmitted by the radiation filter;
    a photodiode arranged to receive radiation transmitted by the passivation layer; and
    circuit elements connected to the photodiode.
18. The radiation sensor of clause 17, wherein the passivation layer comprises boron.
19. The radiation sensor of clause 18, further comprising an adhesive layer comprising silicon located between the passivation layer and the photodiode.
20. The radiation sensor of any of clauses 17 to 19, wherein the photodiode is a CMOS photodiode.
21. A lithographic apparatus arranged to project a pattern from a patterning device onto a substrate, the lithographic apparatus comprising the radiation sensor of any of clauses 17 to 20.
22. A lithographic tool for performing optical measurements, the lithographic tool comprising the radiation sensor of any of clauses 17 to 20.
23. A method of filtering radiation comprising passing the radiation through the radiation filter of any of clauses 1 to 16.
24. A method of performing an optical measurement comprising:
    directing radiation at an object;
    collecting radiation that has interacted with the object;
    passing the collected radiation through a radiation filter according to any of clauses 1 to 16; and;
    detecting the filtered radiation.
25. A method of manufacturing a radiation sensor comprising:
    providing a substrate;
    forming an epitaxial layer on the substrate;
    forming a photodiode in the epitaxial layer;
    forming circuit elements that are connected to the photodiode;
    forming a passivation layer on the epitaxial layer; and,
    forming a radiation filter comprising zirconium and $SiN_3$ on the passivation layer.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A radiation sensor comprising:
   a radiation filter for reducing transmission of an unwanted wavelength of radiation, the radiation filter comprising zirconium and $SiN_3$;
   a passivation layer arranged to receive radiation transmitted by the radiation filter;
   a photodiode arranged to receive radiation transmitted by the passivation layer; and
   circuit elements connected to the photodiode.

2. The radiation sensor of claim 1, wherein the radiation filter includes a first layer comprising the zirconium and a second layer comprising the $SiN_3$.

3. The radiation sensor of claim 2, wherein the first layer is on the second layer.

4. The radiation sensor of claim 2, further comprising a third layer comprising silicon, wherein the third layer is provided on the first layer.

5. The radiation sensor of claim 2, further comprising:
   a third layer comprising the $SiN_3$ and wherein the first layer is located between the second layer and the third layer; and
   a fourth layer comprising silicon, the fourth layer located on the third layer.

6. The radiation sensor of claim 5, wherein the third layer has a thickness of between about 5 nm and about 100 nm.

7. The radiation sensor of claim 4, wherein the third layer has a thickness of between about 5 nm and about 200 nm.

8. The radiation sensor of claim 5, wherein the fourth layer has a thickness of between about 10 nm and about 500 nm.

9. The radiation sensor of claim 2, wherein the first layer has a thickness of between about 10 nm and about 500 nm and/or the second layer has a thickness of between about 5 nm and about 100 nm.

10. The radiation sensor of claim 1, further comprising an anti-reflection layer for increasing the transmission of at least one wavelength of radiation through the radiation filter.

11. The radiation sensor of claim 10, wherein the anti-reflection layer comprises at least one selected from: SiON, CrO, CrN, CrON, $SiN_3$, $SiO_2$ and/or $Al_2O_3$.

12. The radiation sensor of claim 1, further comprising a protective layer for reducing damage to the radiation filter caused by hydrogen radicals.

13. The radiation sensor of claim 12, wherein the protective layer comprises at least one selected from: SiN and/or $SiO_2$.

14. The radiation sensor of claim 1, wherein the passivation layer comprises boron.

15. The radiation sensor of claim 14, further comprising an adhesive layer comprising silicon located between the passivation layer and the photodiode.

16. A lithographic apparatus arranged to project a pattern from a patterning device onto a substrate, the lithographic apparatus comprising the radiation sensor of claim 1.

17. A lithographic tool for performing optical measurements, the lithographic tool comprising the radiation sensor of claim 1.

18. A method of performing an optical measurement, the method comprising:
   directing radiation at an object;
   collecting radiation that has interacted with the object using the radiation sensor according to claim 1;
   passing the collected radiation through the radiation filter of the radiation sensor; and
   detecting the filtered radiation.

19. A method of manufacturing a radiation sensor, the method comprising:
   forming a photodiode on a substrate of the radiation sensor;
   forming circuit elements that are connected to the photodiode;
   forming a passivation layer on the substrate; and
   forming a radiation filter for reducing transmission of an unwanted wavelength of radiation, the radiation filter comprising zirconium and $SiN_3$ wherein the passivation layer is arranged to receive radiation transmitted by the radiation filter and the photodiode is arranged to receive radiation transmitted by the passivation layer.

20. A radiation filter for reducing transmission of an unwanted wavelength of radiation, the radiation filter comprising a first layer comprising zirconium, a second layer comprising $SiN_3$, and a third layer comprising silicon, wherein the third layer is provided on the first layer.

* * * * *